(12) United States Patent
Hong et al.

(10) Patent No.: US 8,149,637 B2
(45) Date of Patent: Apr. 3, 2012

(54) SEMICONDUCTOR DEVICE CAPABLE OF BEING TESTED AFTER PACKAGING

(75) Inventors: Hee-Il Hong, Seongnam-si (KR); Kang-Young Cho, Suwon-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 82 days.

(21) Appl. No.: 12/698,672

(22) Filed: Feb. 2, 2010

(65) Prior Publication Data

US 2010/0296353 A1 Nov. 25, 2010

(30) Foreign Application Priority Data

May 20, 2009 (KR) ........................ 10-2009-0044133

(51) Int. Cl.
*G11C 7/00* (2006.01)
*G11C 29/00* (2006.01)
(52) U.S. Cl. ............... 365/201; 365/189.09; 365/230.06
(58) Field of Classification Search .................. 365/201, 365/189.09, 230.06
See application file for complete search history.

(56) References Cited

U.S. PATENT DOCUMENTS

| 6,016,281 | A | * | 1/2000 | Brox ........................ 365/230.06 |
| 6,031,773 | A | | 2/2000 | Taylor |
| 6,240,014 | B1 | * | 5/2001 | Yoo ........................... 365/185.09 |
| 6,556,491 | B2 | * | 4/2003 | Otsuka et al. ................. 365/201 |
| 2009/0027939 | A1 | * | 1/2009 | Kang ............................. 365/51 |

FOREIGN PATENT DOCUMENTS

| JP | 2002-245795 | 8/2002 |
| JP | 2007-299528 | 11/2007 |

* cited by examiner

*Primary Examiner* — Hoai V Ho
*Assistant Examiner* — Kretelia Graham
(74) *Attorney, Agent, or Firm* — F Chau & Associates, LLC

(57) ABSTRACT

Provided is a semiconductor device capable of effectively testing whether memory cells and a memory cell array are defective. The semiconductor device may include a memory cell array having a plurality of memory cells and an external test pad connected to an internal test pad. A test voltage may be applied to the plurality of word lines connected to the plurality of memory cells via the external test pad and the internal test pad in a test mode, wherein the test voltage disables the plurality of word lines.

14 Claims, 3 Drawing Sheets

SEMICONDUCTOR DEVICE CAPABLE OF BEING TESTED AFTER PACKAGING

CROSS-REFERENCE TO RELATED APPLICATIONS

This application claims priority benefit to Korean Patent Application No. 10-2009-0044133, filed on May 20, 2009, in the Korean Intellectual Property Office, the disclosure of which is incorporated by reference herein in its entirety.

BACKGROUND

1. Technical Field

The inventive concept relates to a semiconductor device, and more particularly, to a semiconductor device capable of effectively testing whether memory cells and a memory cell array are defective.

2. Discussion of Related Art

Various tests are performed to detect a defect in a semiconductor device during manufacture of the semiconductor device. Memory cell defects are usually tested on a wafer level because test voltages can be easily applied to memory cells of the semiconductor device. Once the memory cells are packaged, it may be difficult to apply test voltages to the memory cells.

Therefore, a need exists for a semiconductor device that allows memory cell defects to be tested in a packaged state.

SUMMARY

According to an embodiment of the inventive concept, a semiconductor device comprises a memory cell array including a plurality of memory cells and an external test pad connected to an internal test pad, wherein a test voltage is applied to a plurality of word lines connected to the plurality of memory cells via the external test pad and the internal test pad in a test mode, wherein the test voltage disables the plurality of word lines.

The test voltage may be a negative voltage.

The semiconductor device may further comprise an external pad connected to an internal pad, and a first connection unit connecting the internal pad and the internal test pad in a normal mode and disconnecting the internal pad and the internal test pad in the test mode, in response to a first control signal, wherein a ground voltage is applied to the semiconductor device via the external pad and the internal pad.

The first connection unit may be a switch.

The semiconductor device may further comprise a voltage generator generating a predetermined voltage, connected to the plurality of word lines, and a second connection unit connecting the voltage generator and the internal test pad in the test mode and disconnecting the voltage generator and the internal test pad in the normal mode, in response to a second control signal. The test voltage is applied to the plurality of word lines via the external test pad and the internal test pad in the test mode if the voltage generator is disabled, the predetermined voltage or the test voltage is applied to the plurality of word lines in the test mode if the voltage generator is enabled, and the predetermined voltage is applied to the plurality of word lines via the voltage generator in the normal mode.

The predetermined voltage may be a negative voltage.

The second connection unit may be a switch.

The second control signal may be a mode register set (MRS) signal.

The ground voltage may be applied to the plurality of word lines via the external test pad and the internal test pad in the normal mode.

The first control signal may be a mode register set (MRS) signal.

According to an embodiment of the inventive concept, a memory system apparatus comprises a memory device including a semiconductor device and a controller controlling the memory device. The semiconductor device comprises a memory cell array including a plurality of memory cells, and an external test pad connected to an internal test pad, wherein a test voltage is applied to a plurality of word lines connected to the plurality of memory cells via the external test pad and the internal test pad in a test mode, wherein the test voltage disables the plurality of word lines.

The test voltage may be a negative voltage.

The semiconductor device of the memory system apparatus may further comprise an external pad connected to an internal pad, and a first connection unit connecting the internal pad and the internal test pad in a normal mode and disconnecting the internal pad and the internal test pad in the test mode, in response to a first control signal, wherein a ground voltage is applied to the semiconductor device via the external pad and the internal pad.

The semiconductor device of the memory system apparatus may further comprise a voltage generator generating a predetermined voltage, connected to the plurality of word lines, and a second connection unit connecting the voltage generator and the internal test pad in the test mode and disconnecting the voltage generator and the internal test pad in the normal mode, in response to a second control signal. The test voltage is applied to the plurality of word lines via the external test pad and the internal test pad in the test mode if the voltage generator is disabled, the predetermined voltage or the test voltage is applied to the plurality of word lines in the test mode if the voltage generator is enabled, and the predetermined voltage is applied to the plurality of word lines via the voltage generator in the normal mode.

The ground voltage may be applied to the plurality of word lines via the external test pad and the internal test pad in the normal mode.

According to an embodiment of the inventive concept, a method for testing a semiconductor device comprises the steps of applying a ground voltage to the semiconductor device via an external pad and an internal pad, applying a test voltage to a plurality of word lines connected to a plurality of memory cells of a memory cell array via an external test pad and an internal test pad in a test mode, wherein the test voltage disables the plurality of word lines, and applying the ground voltage to the plurality of word lines in a normal mode, wherein a control signal received by a connection unit determines whether the semiconductor device is in the test mode or the normal mode.

The method may further comprise applying the test voltage to the plurality of word lines via the external test pad and the internal test pad in the test mode if a voltage generator is disabled, applying a predetermined voltage to the plurality of word lines via the voltage generator in the test mode if the voltage generator is enabled, and applying the predetermined voltage to the plurality of word lines via the voltage generator in the normal mode.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION OF THE EXEMPLARY EMBODIMENTS

Figure 1:
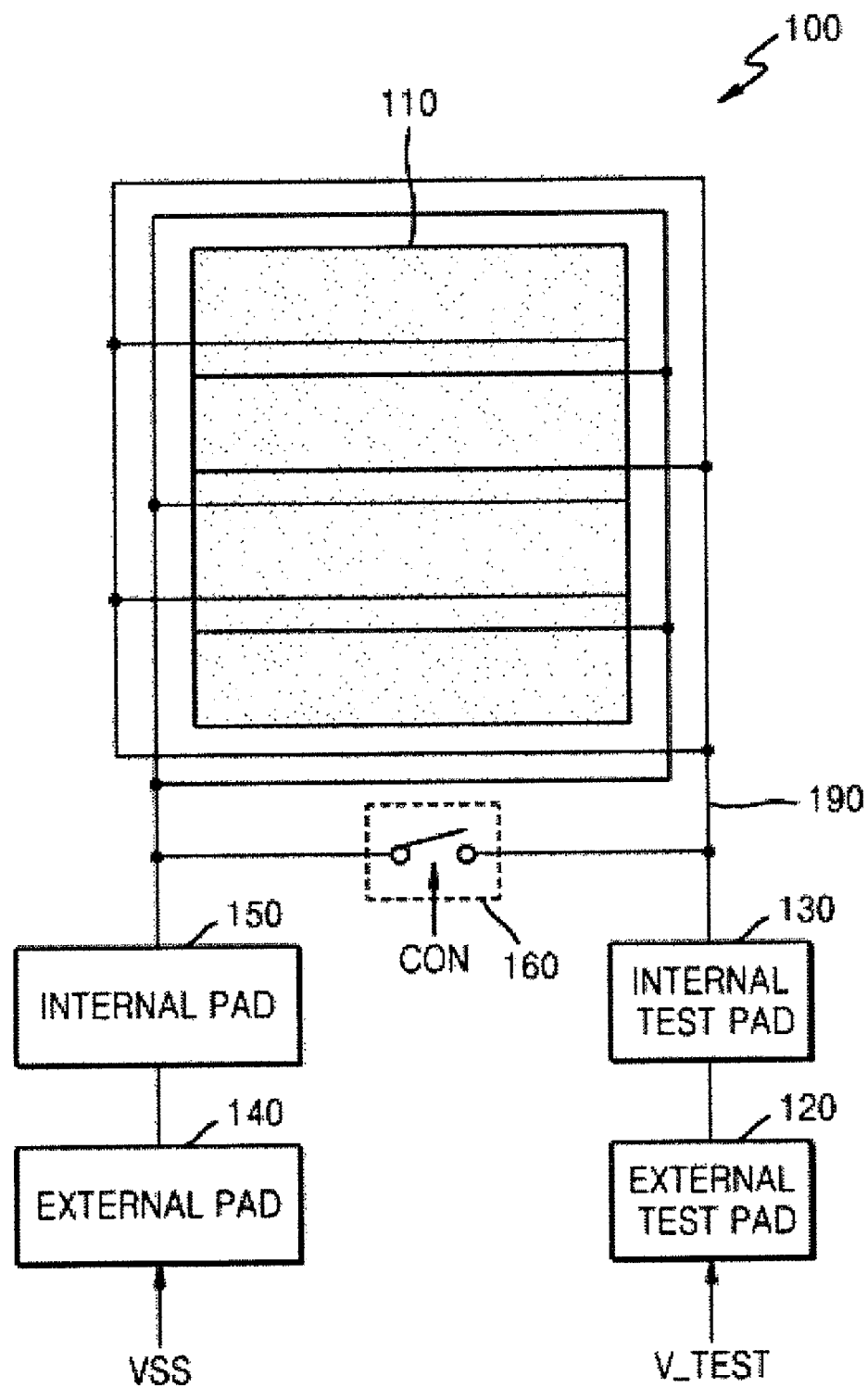
FIG. 1 is a block diagram of a semiconductor device according to an embodiment of the inventive concept.

Hereinafter, exemplary embodiments of the inventive concept will be described with reference to the accompanying drawings. Like reference numerals denote like elements throughout the drawings. The inventive concept, may however, be embodied in many different forms and should not be construed as limited to the embodiments set forth herein.

FIG. 1 is a block diagram of a semiconductor device 100 according to an embodiment of the inventive concept. Referring to FIG. 1, the semiconductor device 100 includes a memory cell array 110, an external test pad 120, an internal test pad 130, an external pad 140, and an internal pad 150.

The memory cell array 110 may include a plurality of memory cells (not shown). Each of the memory cells is respectively connected to one of a plurality of word lines 190 and one of a plurality of bit lines. The construction of such a memory cell would be a routine undertaking for those of ordinary skill in the art and thus will not be explained here.

In the embodiment illustrated in FIG. 1, a test voltage V_TEST is applied to the external test pad 120 in a test mode to determine whether the memory cells are defective. The external test pad 120 is connected to the internal test pad 130. The test voltage V_TEST is applied to the word lines 190 connected to the memory cells of the memory cell array 110 via the internal test pad 130, as a word line disable voltage (e.g., a voltage applied to disable the plurality of word lines 190). The external test pad 120 may be one of a plurality of external pads commonly included in semiconductor devices, to which a ground voltage VSS is normally applied to. Alternatively, the external test pad 120 may be an external pad that is not generally employed in semiconductor devices.

The test voltage V_TEST may be one of various levels. For example, the test voltage V_TEST may be a negative voltage. In general, when semiconductor devices are to be tested in a packaged state, a predetermined voltage cannot be applied as a word line disable voltage to word lines connected to memory cells. However, according to the current embodiment, the semiconductor device 100 may be tested after it has been packaged by applying a predetermined voltage to the word lines 190 via the external test pad 120.

The ground voltage VSS is applied to the external pad 140 to operate the semiconductor device 100. The internal pad 150 is connected to the external pad 140. The ground voltage VSS is applied to the memory cells and the memory cell array 110 of the semiconductor device 100 via the internal pad 150.

In an embodiment of the inventive concept, the semiconductor device 100 may further include a connection unit 160. The connection unit 160 connects or disconnects the internal test pad 130 and the internal pad 150, in response to a control signal CON. For example, when the internal test pad 130 and the internal pad 150 are connected by the connection unit 160, the voltages of the pads will be equal, and when the internal test pad 130 and the internal pad 150 are disconnected by the connection unit 160, the voltages of the pads will be different.

In an embodiment of the inventive concept, the connection unit 160 may be embodied as a switch and the control signal CON may be a mode register set (MRS) signal, however, the inventive concept is not limited to such an embodiment.

The operation of the semiconductor device 100 will now be described according to an embodiment wherein an external pad from among a semiconductor device's plurality of external pads is used as the external test pad 120 to which the ground voltage VSS is applied.

In the test mode, the connection unit 160 may disconnect the internal test pad 130 and the internal pad 150 from each other, in response to the control signal CON. In this case, the ground voltage VSS applied to the external pad 140 is applied to an inside of the semiconductor device 100, and the test voltage V_TEST applied to the external test pad 120 is applied as the word line disable voltage to the word lines 190.

In a normal mode in which the semiconductor device 100 is not tested and performs general operations, the connection unit 160 may connect the internal test pad 130 and the internal pad 150 to each other. In this case, the voltage of the internal test pad 130 is equal to that of the internal pad 150. For example, in the normal mode, the ground voltage VSS is applied to the external test pad 120 and the external pad 140, the internal test pad 130 and the internal pad 150 are connected to each other, and thus the ground voltage VSS may be stably applied to the semiconductor device 100.

Unless the same voltage is applied to the external test pad 120 and the external pad 140 in the normal mode, the semiconductor device 100 may normally perform a test operation and a normal operation without having to include the connection unit 160. For example, when an external pad that is not generally employed in semiconductor devices is used as the external test pad 120, the semiconductor device 100 may not include the connection unit 160.

Figure 2:
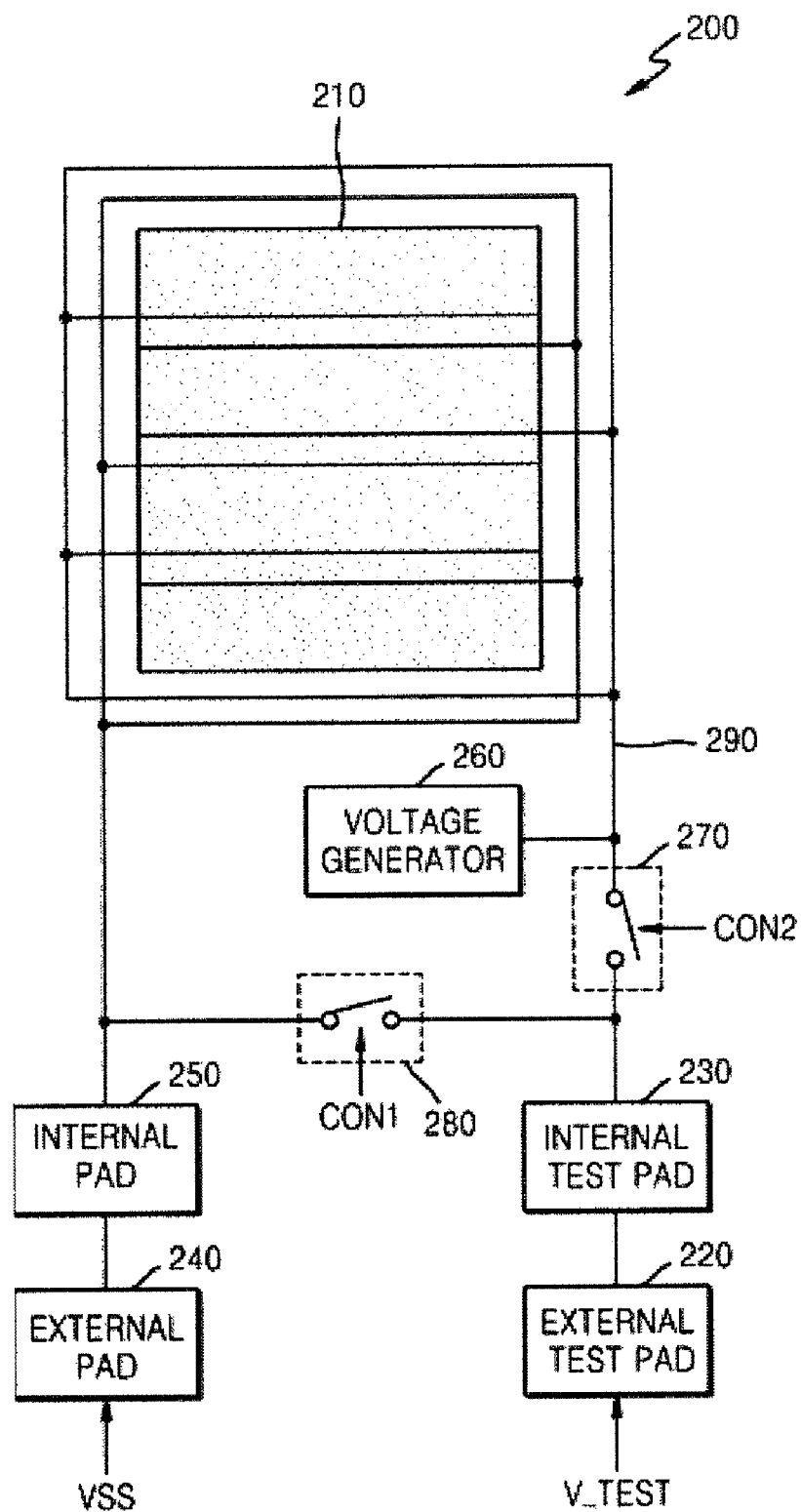
FIG. 2 is a block diagram of a semiconductor device according to another embodiment of the inventive concept.

FIG. 2 is a block diagram of a semiconductor device 200 according to another embodiment of the inventive concept. Referring to FIG. 2, the semiconductor device 200 may include a memory cell array 210, an external test pad 220, an internal test pad 230, an external pad 240, an internal pad 250, a first connection unit 280 and a voltage generator 260.

The memory cell array 210, the external test pad 220, the internal test pad 230, the external pad 240, and the internal pad 250 illustrated in FIG. 2, are respectively the same as the memory cell array 110, the external test pad 120, the internal test pad 130, the external pad 140, and the internal pad 150 illustrated in FIG. 1, and thus will not be explained again here. Similarly, the first connection unit 280 performs the same operation as the connection unit 160 of FIG. 1. For example, the first connection unit 280 connects or disconnects the internal test pad 230 and the internal pad 250, in response to a first control signal CON1. For example, when the internal test pad 230 and the internal pad 250 are connected by the first connection unit 280, the voltages of the pads will be equal, and when the internal test pad 230 and the internal pad 250 are disconnected by the first connection unit 280, the voltages of the pads will be different. In an embodiment of the inventive concept, the first connection unit 280 may comprise a switch and the first control signal CON1 may comprise a mode register set (MRS) signal, however, the inventive concept is not limited to such an embodiment.

The semiconductor device 200 of FIG. 2 may further include the voltage generator 260 and a second connection unit 270. The voltage generator 260 generates a predetermined voltage and applies the predetermined voltage as a word line disable voltage to word lines 290 connected to a plurality of memory cells of the memory cell array 210. The predetermined voltage may be a negative voltage. The second connection unit 270 connects or disconnects output terminals of the internal test pad 230 and the voltage generator 260, in response to a second control signal CON2. In an embodiment of the inventive concept, the second connection unit 270 may comprise a switch and the second control signal CON2 may comprise a mode register set (MRS) signal, however, the inventive concept is not limited to such an embodiment.

In the test mode, the second connection unit 270 may connect the output terminals of the internal test pad 230 and the voltage generator 260 to each other, in response to the second control signal CON2. Thus, a ground voltage VSS applied to the external pad 240 is applied to an inside of the semiconductor device 200, and a test voltage V_TEST applied to the external test pad 220 is applied as the word line disable voltage to the word lines 290. In the test mode, the voltage generator 260 may be enabled or disabled. If the voltage generator 260 is disabled, the test voltage V_TEST applied to the external test pad 220 is applied as the word line disable voltage to the word lines 290. If the voltage generator 260 is enabled, either an output signal of the voltage generator 260 or the test voltage V_TEST is applied as the word line disable voltage to the word lines 290.

In the normal mode, the second connection unit 270 may disconnect the output terminals of the internal test pad 230 and the voltage generator 260 from each other. Thus, the ground voltage VSS applied to the external pad 240 is applied to an inside of the semiconductor device 200, and the output signal of the voltage generator 260 is applied to the word lines 290.

The operation of the semiconductor device 200 will now be described according to an embodiment wherein an external pad from among a semiconductor device's plurality of external pads is used as the external test pad 220 to which the ground voltage VSS is applied.

In the test mode, the first connection unit 280 may disconnect the internal test pad 230 and the internal pad 250 from each other, in response to the first control signal CON1. Also, as described above, the second connection unit 270 may connect the output terminals of the internal test pad 230 and the voltage generator 260 to each other, in response to the second control signal CON2. In this case, the ground voltage VSS applied to the external pad 240 is applied to an inside of the semiconductor device 200. If the voltage generator 260 is disabled, the test voltage V_TEST applied to the external test pad 220 is applied as the word line disable voltage to the word lines 290. If the voltage generator 260 is enabled, either an output signal of the voltage generator 260 or the test voltage V_TEST is applied as the word line disable voltage to the word lines 290.

In the normal mode, the first connection unit 280 may connect the internal test pad 230 and the internal pad 250 to each other. In this case, the voltage of the internal test pad 230 is equal to that of the internal pad 250. For example, in the normal mode, the ground voltage VSS is applied to the external test pad 220 and the external pad 240, the internal test pad 230 and the internal pad 250 are connected to each other, and thus the ground voltage VSS may be stably applied to the semiconductor device 200. Also, as described above, the second connection unit 270 may disconnect the output terminals of the internal test pad 230 and the voltage generator 260 from each other, in response to the second control signal CON2. Accordingly, in this configuration, the output signal of the voltage generator 260 is applied as the word line disable voltage to the word lines 290.

As described above with reference to FIG. 1, unless the same voltage is applied to the external test pad 220 and the external pad 240 in the normal mode, the semiconductor device 200 may normally perform a test operation and a normal operation without having to include the first connection unit 280.

Figure 3:
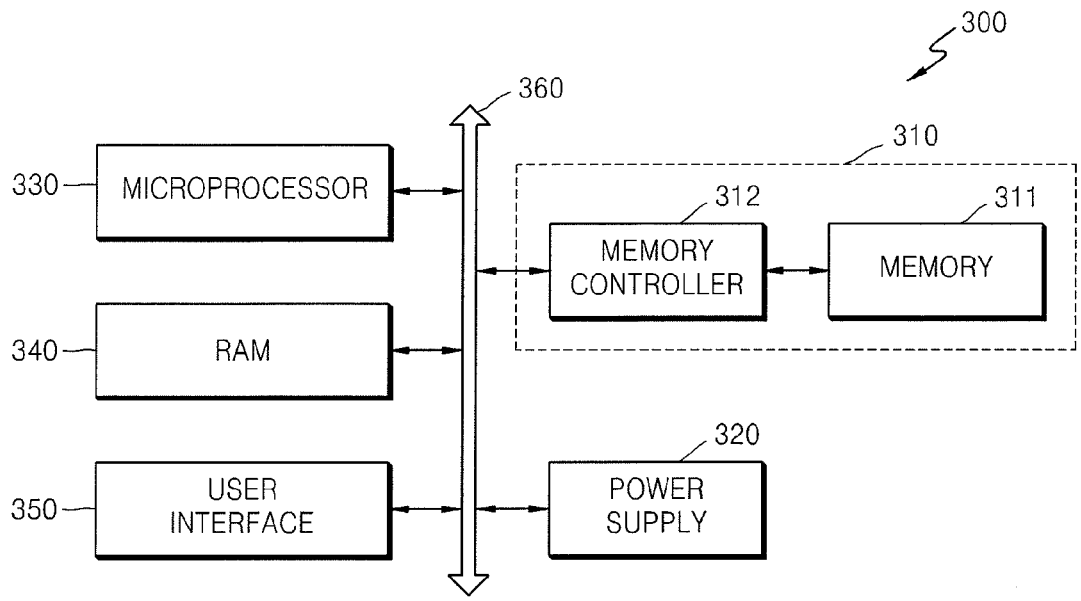
FIG. 3 is a block diagram of a computing system apparatus having a semiconductor device according to an embodiment of the inventive concept.

FIG. 3 is a block diagram of a computing system apparatus 300 having a semiconductor device according to an embodiment of the inventive concept. Referring to FIG. 3, the computing system apparatus 300 may include a microprocessor 330, a user interface 350, and a memory device 310 that are electrically connected to a bus 360. The memory device 310 may include a memory 311 and a memory controller 312. The memory 311 may include the semiconductor device 100 of FIG. 1 or the semiconductor device 200 of FIG. 2. The memory controller 312 may control the memory 311. In the current embodiment, the computing system apparatus 300 may further include a random access memory (RAM) 340 and a power supply device 320.

If the computing system apparatus 300 is a mobile device, the computing system apparatus 300 may further include a battery that supplies power for operating the computing system apparatus 300, and a modem, such as a baseband chipset. The computing system apparatus 300 may include other components as contemplated by those of ordinary skill in the art, including, but not limited to, an application chipset, a camera image processor (CIS), or a mobile dynamic random access memory (DRAM).

In an embodiment of the inventive concept, the memory 311 and the memory controller 312 may form a solid state drive/disk (SSD) that uses a non-volatile memory to store data.

Figure 4:
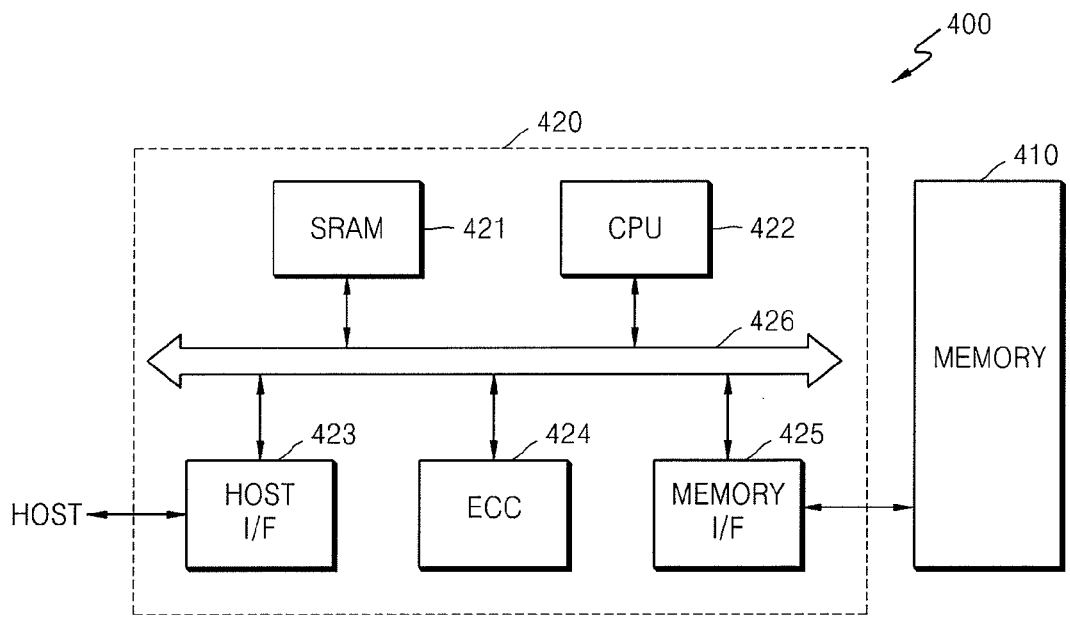
FIG. 4 is a block diagram of a memory card having a semiconductor device according to an embodiment of the inventive concept.

FIG. 4 is a block diagram of a memory card 400 having a semiconductor device according to an embodiment of the inventive concept. Referring to FIG. 4, the memory card 400 may include a memory device 410 and a memory controller 420. The memory device 410 may include the semiconductor device 100 of FIG. 1 or the semiconductor device 200 of FIG. 2. The memory controller 420 may control the memory device 410. The memory controller 420 may be constructed to communicate with a host via one of various interface protocols, such as, for example, a universal serial bus (USB), a MultiMediaCard (MMC), a Peripheral Component Interconnect Express (PCI-E), a Serial Advanced Technology Attachment (SATA), a Parallel Advanced Technology Attachment (PATA), a Small Computer System Interface (SCSI), an Enhanced Small Device Interface (ESDI), and an Integrated Drive Electronics (IDE). The construction and operation of a central processing unit (CPU) 422, a synchronous random access memory (SRAM) 421, a host interface (I/F) 423, an ECC 424, a memory I/F 425, and a bus 426 that may be included in the memory controller 420 would be a routine undertaking for those of ordinary skill in the art, and therefore a detailed description thereof will not be provided here.

The memory devices according to the above embodiments may be mounted using various packages, such as, for example, a package-on-package (PoP), ball grid arrays (BGAs), chip-scale packages (CSPs), a plastic-leaded chip carrier (PLCC), a plastic dual in-line package (PDIP), a die-in waffle pack, a die-in wafer form, a chip-on board (COB), a ceramic dual in-line package (CERDIP), a plastic metric quad flat pack (MQFP), a thin quad flatpack (TQFP), a small outline integrated circuit (SOIC), a shrink small outline package (SSOP), a thin small outline package (TSOP), a thin quad flatpack (TQFP), a system-in package (SIP), a multi-chip package (MCP), a wafer-level fabricated package (WFP), and a wafer-level processed stack package (WSP).

While the inventive concept has been particularly shown and described with reference to exemplary embodiments thereof, it will be understood that various changes in form and details may be made therein without departing from the spirit and scope of the following claims.

What is claimed is:

1. A semiconductor device comprising:
   a memory cell array including a plurality of memory cells;
   an external test pad connected to an internal test pad;
   an external pad connected to an internal pad; and
   a first connection unit connecting the internal pad and the internal test pad in a normal mode and disconnecting the internal pad and the internal test pad in a test mode, in response to a first control signal, wherein,
   a test voltage is applied to a plurality of word lines connected to the plurality of memory cells via the external test pad and the internal test pad in the test mode, the test voltage disables the plurality of word lines, and a ground voltage is applied to the semiconductor device via the external pad and the internal pad.

2. The semiconductor device of claim 1, wherein the test voltage is a negative voltage.

3. The semiconductor device of claim 1, wherein the first connection unit is a switch.

4. The semiconductor device of claim 1, further comprising:
   a voltage generator generating a predetermined voltage, connected to the plurality of word lines; and
   a second connection unit connecting the voltage generator and the internal test pad in the test mode and disconnecting the voltage generator and the internal test pad in the normal mode, in response to a second control signal, wherein,
   the test voltage is applied to the plurality of word lines via the external test pad and the internal test pad in the test mode, if the voltage generator is disabled,
   the predetermined voltage or the test voltage is applied to the plurality of word lines in the test mode, if the voltage generator is enabled, and
   the predetermined voltage is applied to the plurality of word lines via the voltage generator in the normal mode.

5. The semiconductor device of claim 4, wherein the predetermined voltage is a negative voltage.

6. The semiconductor device of claim 4, wherein the second connection unit is a switch.

7. The semiconductor device of claim 4, wherein the second control signal is a mode register set (MRS) signal.

8. The semiconductor device of claim 1, wherein the ground voltage is applied to the plurality of word lines via the external test pad and the internal test pad in the normal mode.

9. The semiconductor device of claim 1, wherein the first control signal is a mode register set (MRS) signal.

10. A memory system apparatus comprising:
    a memory device including a semiconductor device and a controller controlling the memory device, wherein the semiconductor device comprises:
    a memory cell array including a plurality of memory cells;
    an external test pad connected to an internal test pad;
    an external pad connected to an internal pad; and
    a first connection unit connecting the internal pad and the internal test pad in a normal mode and disconnecting the internal pad and the internal test pad in a test mode, in response to a first control signal, wherein,
    a test voltage is applied to a plurality of word lines connected to the plurality of memory cells via the external test pad and the internal test pad in the test mode, the test voltage disables the plurality of word lines, and a ground voltage is applied to the semiconductor device via the external pad and the internal pad.

11. The memory system apparatus of claim 10, wherein the test voltage is a negative voltage.

12. The memory system apparatus of claim 10, wherein the semiconductor device further comprises:
    a voltage generator generating a predetermined voltage, connected to the plurality of word lines; and
    a second connection unit connecting the voltage generator and the internal test pad in the test mode and disconnecting the voltage generator and the internal test pad in the normal mode, in response to a second control signal, wherein,
    the test voltage is applied to the plurality of word lines via the external test pad and the
    internal test pad in the test mode, if the voltage generator is disabled,
    the predetermined voltage or the test voltage is applied to the plurality of word lines in the test mode, if the voltage generator is enabled, and
    the predetermined voltage is applied to the plurality of word lines via the voltage generator in the normal mode.

13. The memory system apparatus of claim 10, wherein the ground voltage is applied to the plurality of word lines via the external test pad and the internal test pad in the normal mode.

14. A method for testing a semiconductor device, comprising the steps of:
    applying a ground voltage to the semiconductor device via an external pad and an internal pad;
    applying a test voltage to a plurality of word lines connected to a plurality of memory cells of a memory cell array, via an external test pad and an internal test pad, in a test mode, wherein the test voltage disables the plurality of word lines;
    applying the ground voltage to the plurality of word lines in a normal mode, wherein,
    a control signal received by a connection unit determines whether the semiconductor device is in the test mode or the normal mode;
    applying the test voltage to the plurality of word lines via the external test pad and the internal test pad in the test mode, if a voltage generator is disabled;
    applying a predetermined voltage to the plurality of word lines via the voltage generator in the test mode, if the voltage generator is enabled; and
    applying the predetermined voltage to the plurality of word lines via the voltage generator in the normal mode.

* * * * *